United States Patent
Takahashi et al.

(10) Patent No.: US 6,638,689 B1
(45) Date of Patent: *Oct. 28, 2003

(54) PHOTORESIST COMPOSITIONS AND FLEXIBLE PRINTED WIRING BOARDS WITH PROTECTIVE LAYER

(75) Inventors: Satoshi Takahashi, Tochigi (JP); Akira Tsutsumi, Tochigi (JP); Koichi Uno, Tochigi (JP); Minoru Nagashima, Tochigi (JP)

(73) Assignee: Sony Chemicals Corp., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/288,240

(22) Filed: Apr. 8, 1999

(30) Foreign Application Priority Data

Apr. 10, 1998 (JP) .......................... 10-099336

(51) Int. Cl.$^7$ .................................. G03F 7/40
(52) U.S. Cl. ................. 430/313; 430/330; 430/317; 430/281.1; 430/285.1; 430/905; 430/906; 430/907; 430/909; 430/910; 430/287.1; 430/286.1
(58) Field of Search .................. 430/281.1, 285.1, 430/905, 906, 909, 910, 907, 313, 317, 330

(56) References Cited

U.S. PATENT DOCUMENTS

| | | | |
|---|---|---|---|
| 4,224,225 A | * 9/1980 | Noguchi et al. | 430/281.1 |
| 4,291,115 A | * 9/1981 | Chambers | 430/271.1 |
| 4,293,635 A | * 10/1981 | Flint et al. | 430/281.1 |
| 4,952,481 A | * 8/1990 | Seio et al. | 430/284.1 |
| 5,049,481 A | * 9/1991 | Okamoto et al. | 430/281.1 |
| 5,221,589 A | * 6/1993 | Nanba et al. | 430/283.1 |
| 5,688,632 A | * 11/1997 | Kashio et al. | 430/281.1 |

FOREIGN PATENT DOCUMENTS

| | | |
|---|---|---|
| JP | A-58-76827 | 5/1983 |
| JP | A-62-299840 | 12/1987 |
| JP | A-5-254064 | 10/1993 |
| JP | A-5-283851 | 10/1993 |
| JP | A-7-49567 | 2/1995 |
| JP | A-7-234509 | 9/1995 |
| JP | A 9-18114 | 1/1997 |
| JP | 9-18114 | * 1/1997 |

OTHER PUBLICATIONS

JP409018114A—English Abstract (JPO) of JP 9–18114, File: JPAB, Published Jan. 17, 1997.*
English Translation of JP 9–18114 (Published on Jan. 17, 1997) by *Derwent Thomson Scientific*.*
STN data base search ('File Registry') on the compounds N,N'–Dimethylaminoethyl methacrylate and N,N–Dimethylaminoethyl methacrylate.*

* cited by examiner

*Primary Examiner*—Cynthia Hamilton
(74) *Attorney, Agent, or Firm*—Oliff & Berridge, PLC

(57) ABSTRACT

Photoresist compositions, which can attain high-accuracy etching without causing separation and flexible printed wiring boards prepared with the photoresist compositions are disclosed. In order to etch a polyimide precursor layer on a conductive circuit, a photoresist composition comprising a photopolymerizable organic material (A), a water-soluble resin (B) and an amino-group-containing resin (C) is applied on the surface of the polyimide precursor layer to form a photoresist layer. Then, the photoresist layer is patterned by a photolithographic process. The polyimide precursor layer is etched and the pattern of the photoresist layer is transferred to the polyimide precursor layer. The amino-group-containing resin (C) in the photoresist layer is combined with an acid anhydride in the polyimide precursor layer to attain good adhesion and high-accuracy etching without causing separation of the photoresist layer. Alternatively, a film can be formed from the photoresist composition and then be applied on the surface of the polyimide precursor layer to form a photoresist layer.

2 Claims, 1 Drawing Sheet

PHOTORESIST COMPOSITIONS AND FLEXIBLE PRINTED WIRING BOARDS WITH PROTECTIVE LAYER

FIELD OF THE INVENTION

The present invention relates to photoresist compositions, particularly those well suitable for etching a polyimide layer forming a protective layer of a flexible printed wiring board. The present invention also relates to flexible printed wiring boards having a protective layer consisting of a polyimide layer formed with said photoresist compositions.

PRIOR ART

Flexible wiring boards having a protective layer on the conductive circuit have previously been widely known. This protective layer serves to protect the conductive circuit and to provide an insulating coating for the conductive circuit, and has commonly been formed by applying a polyimide film having an adhesive layer called as an adhesive-backed polyimide film on the conductive circuit.

The polyimide film has been punched to expose terminal parts of the conductive circuit or to apply the polyimide film to an intended location.

We previously proposed a preparation process described in JPA No. 18114/97 to solve the problems associated with punching of the polyimide film, such as punching accuracy or die costs and insufficient film strength of the punched polyimide film for continuous production.

This preparation process succeeded in achieving the initial purpose of providing a flexible wiring board without need of punching the polyimide film, by forming a laminate of a polyimide precursor layer and a photoresist layer on a copper foil (using a composite film of a polyimide precursor layer and a photoresist layer laminated to each other in the examples), patterning said laminate via exposure and development, and etching the polyimide precursor layer through the patterned photoresist layer as a mask.

However, some problems remain outstanding. Namely, a problem lies in that the photoresist layer is separated from the polyimide precursor layer under the action of the etching solution (alkaline developing solution) to fail in sufficiently protecting the polyimide precursor layer when the etching period is extended in accordance with the thickness of the polyimide precursor layer or the constituent materials of the polyimide precursor layer.

Another problem lies in that the pattern width tends to be narrower than intended during patterning of the photoresist layer, and the width of the polyimide precursor layer also becomes narrower than intended along said pattern width during the subsequent etching of the polyimide precursor layer.

Thus, any prior art has not entered into photoresist materials through which the polyimide precursor layer is etched and further improvement has been demanded.

In order to solve the above problems, the first object of the present invention is to provide a photoresist composition which prevents separation of the photoresist layer formed on a polyimide precursor layer during etching.

The second object of the present invention is to provide a photoresist composition, which can improve patterning accuracy during patterning of the photoresist layer. The third object of the present invention is to provide a flexible wiring board having a protective layer obtained by etching a polyimide precursor layer using a photoresist composition fulfilling the first and second objects.

SUMMARY OF THE INVENTION

Thus, the invention of the present application relates to a photoresist composition for etching a polyimide precursor layer on a conductive circuit, comprising a photopolymerizable organic material (A) (including either one or both or a composition of photopolymerizable oligomer and photopolymerizable monomer; hereinafter the same in this invention), a water-soluble resin (B) and an amino-group-containing resin (C).

The invention relates to a photoresist composition for etching a polyimide precursor layer on a conductive circuit, comprising a photopolymerizable organic material (A), a water-soluble resin (B) and an amino-group-containing resin (C), wherein the water-soluble resin (B) includes either one or both of a water-soluble nylon and an alcohol-soluble nylon.

The invention relates to a photoresist composition for etching a polyimide precursor layer on a conductive circuit, comprising a photopolymerizable organic material (A) and a water-soluble resin (B), and further comprising an amino-group-containing resin (C) in the range from 0.5 parts by weight to 6.0 parts by weight both inclusive based on 100 parts by weight of the total weight of the photopolymerizable organic material (A) and the water-soluble resin (B).

The invention relates to a photoresist composition for etching a polyimide precursor layer on a conductive circuit, comprising a photopolymerizable organic material (A) and a water-soluble resin (B) including either one or both of a water-soluble nylon and an alcohol-soluble nylon, and further comprising an amino-group-containing resin (C) in the range from 0.5 parts by weight to 6.0 parts by weight both inclusive based on 100 parts by weight of the total weight of the photopolymerizable organic material (A) and the water-soluble resin (B).

Above mentioned photoresist composition wherein the amino-group containing resin (C) is acrylic resin.

The invention relates to a flexible printed wiring board having a conductive circuit and a polyimide precursor layer on the conductive circuit, wherein the polyimide precursor layer has a pattern obtained by the steps of applying a photoresist composition comprising a photopolymerizable organic material (A), a water-soluble resin (B) and an amino-group-containing resin (C) on the surface of the polyimide precursor layer to form a photoresist layer, then patterning the photoresist layer and transferring the pattern of the photoresist layer to the polyimide precursor layer by etching.

The invention relates to a flexible printed wiring board, wherein the polyimide precursor layer is imidated after the pattern of the photoresist layer has been transferred thereto.

The invention relates to a flexible printed wiring board, wherein the water-soluble resin (B) includes either one or both of a water-soluble nylon and an alcohol-soluble nylon.

The invention relates to a flexible printed wiring board, which comprises an amino-group-containing resin (C) in the range from 0.5 parts by weight to 6.0 parts by weight both inclusive based on 100 parts by weight of the total weight of the photopolymerizable organic material (A) and the water-soluble resin (B).

The invention relates to a flexible printed wiring board having a conductive circuit and a polyimide precursor layer on the conductive circuit, wherein the polyimide precursor layer has a pattern obtained by the steps of applying a photoresist layer formed from a photoresist composition comprising a photopolymerizable organic material (A), a water-soluble resin (B) and an amino-group-containing resin (C) on the surface of the polyimide precursor layer, then patterning the photoresist layer and transferring the pattern of the photoresist layer to the polyimide precursor layer by etching.

The invention relates to a flexible printed wiring board, wherein the polyimide precursor layer is imidated after the pattern of the photoresist layer has been transferred.

The invention relates to a flexible printed wiring board, wherein the water-soluble resin (B) includes either one or both of a water-soluble nylon and an alcohol-soluble nylon.

The invention relates to a flexible printed wiring board, which comprises an amino-group-containing resin (C) in the range from 0.5 parts by weight to 6.0 parts by weight both inclusive based on 100 parts by weight of the total weight of the photopolymerizable organic material (A) and the water-soluble resin (B).

Above mentioned flexible printed wiring board wherein the amino-group-containing resin (C) is acrylic resin.

We attempted to enhance adhesion between the polyimide precursor layer and the photoresist layer in order to attain the objects of the present invention.

Thus, the polyimide precursor layer consists of a polyamic acid containing an acid anhydride and an aromatic diamine, and the acid anhydride has both of a carboxylate group attached to an amine and a carboxylate group unattached to an amine.

Having paid attention to the carboxylate group unattached to an amine in the polyimide precursor layer, we found that adhesion is improved by incorporating the resin (C) containing an amino group into the photoresist layer to react the carboxylate group in the polyimide precursor layer and the amino group in the photoresist layer or to allow the carboxylate group in the polyimide precursor layer and the amino group in the photoresist layer to be strongly attracted to each other, and thus accomplished the present invention.

We also conceived of incorporating a monomer containing an amino group into the photopolymerizable organic material (A), but we did not choose it because such a monomer tends to evaporate immediately after application of a photoresist composition on the polyimide precursor layer due to its low boiling point and accordingly can not help to stably enhance adhesion to the polyimide precursor layer.

When the water-soluble resin (B) is a water-soluble nylon and/or an alcohol-soluble nylon of this invention, etching resistance of the photoresist layer can be enhanced to further prevent separation of the photoresist layer.

When the content of the amino-group-containing resin (C) in the photoresist composition is within a specific range of this invention, patterning accuracy of the photoresist layer can be improved.

Figure 1A:
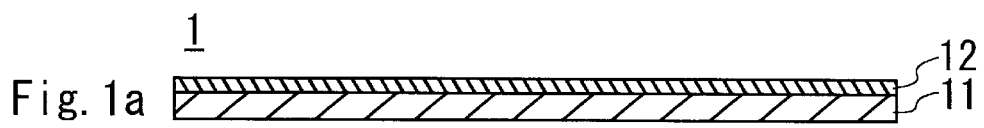
FIG. 1a shows a substrate on which a copper foil has been patterned.

Numeral references represent the following elements: 11, 21: resin film; 12, 22: conductive circuit; 13, 23: polyimide precursor; 14: resist film; 16, 26: termial part; 18, 28: opening; 25: adhesive layer.

DETAILED DESCRIPTION OF THE INVENTION

Preferred embodiments of photoresist compositions according to the present invention and flexible printed wiring boards prepared with said compositions will now be described in detail.

(1) Photoresist compositions

Photoresist compositions of the present invention comprise at least a photopolymerizable organic material (A) (as mentioned above, including either one or both or a composition of photopolymerizable oligomer and photopolymerizable monomer; hereinafter the same in this invention), a water-soluble resin (B) and an amino-group-containing resin (C).

The photopolymerizable oligomer can be typically selected from acrylic or methacrylic oligomers known for use in photoresists, but it is preferable to use oligomers having an OH group because uncured portions of the photoresist layer can be easily removed during exposure.

Examples are tetramethylolmethane triacrylate, butanediol monoacrylate, 2-hydroxyethyl acrylate, 2-hydroxypropyl acrylate, ECH (epichlorhydrin)-modified ethylene glycol diacrylate, ECH (epichlorhydrin)-modified propylene glycol diacrylate, etc. Such a photopolymerizable organic material (A) is present in a photoresist composition typically in the range from 30% by weight to 90% by weight both inclusive.

According to the present invention, the water-soluble resin (B) is incorporated to improve separation of the photoresist layer after etching.

The water-soluble resin (B) here is preferably selected from water-soluble nylons and/or alcohol-soluble nylons because they improve etching resistance of the photoresist layer to contribute to prevention of separation of the photoresist layer.

Such water-soluble nylons and/or alcohol-soluble nylons are commercially available as, for example, AQ nylon series (Toray Industries, Inc.), Diamide T series (Dicel-Hüls Ltc.), etc. These water-soluble resins can preferably be used in a photoresist composition in the range from 20% by weight to 50% by weight.

According to the present invention, an amino-group-containing resin (C) is incorporated to improve adhesion between the polyimide precursor layer and the photoresist layer.

The amino-group-containing resin (C) here can preferably be selected from single polymers of an acrylate or methacrylate having an amino group or copolymers thereof with other copolymerizable monomers or polymers of allylamine because of their compatibility with the photopolymerizable organic material (A) and the water-soluble resin (B).

The acrylate or methacrylate having an amino group includes, for example, N,N-dimethyl aminoacrylate, N,N-diethylaminoethyl acrylate, N,N-dimethyl aminomethacrylate, N,N-diethylaminoethyl methacrylate.

Said other copolymerizable monomers include methyl acrylate, ethyl acrylate, butyl acrylate, methyl methacrylate, hydroxyethyl acrylate, hydroxymethyl methacrylate, hydroxyethyl methacrylate, hydroxypropyl methacrylate, styrene monomer, butadiene monomer.

Said amino-group-containing resin (C) can be used within the range from 0.5 parts by weight to 6.0 parts by weight both inclusive, more preferably from 1.0 part by weight to 5.0 parts by weight both inclusive based on 100 parts by weight of the total of the photopolymerizable organic material (A) and the water-soluble resin (B).

If the content is less than 1.0 part by weight, the effect of the present invention may not be stably produced with some of the above-mentioned types of the polymerizable oligomer (A). If it exceeds 5.0 parts by weight, however, some types of the polyimide precursor layer excessively adhere to the photoresist layer to impair separation of the photoresist layer after etching.

In addition, photoinitiators such as thioxanthone, 2-methylxanthone, 2,4-dimethylxanthone, 2,4-diethylxanthone and photoinitiation aids such as N-methyldiethanolamine, p-dimethylaminobenzoic acid ethyl ester, 2,2-dimethoxy-1,2-diphenylethane-1-one, diethoxyacetophenone can be used in the present invention.

These photoinitiators and photoiniation aids are preferably used in an amount of from 0.1 part by weight to parts by weight based on 100 parts by weight of the photopolymerizable organic material (A).

In order to increase the photosensitivity of the photoresist layer, about 0.1% of inactive blue or green pigments such as Victoria blue, phthalocyanine blue, phthalocyanine green may be added in the photoresist layer.

Then, the photopolymerizable organic material (A), water-soluble resin (B) and amino-group-containing resin (C) optionally with photoinitiators and photoinitiation aids are homogenized by stirring and mixing in a solvent for dissolving them, such as toluene, methyl ethyl ketone, ethanol, isopropyl alcohol, ethyl acetate, for use as a photoresist composition solution.

(2) Preparation of a flexible printed wiring board using a photoresist composition of the present invention Now, an example of the preparation of a flexible printed wiring board using a photoresist composition of the present invention will be explained. Typical examples of the copper-clad film carrying a conductive circuit according to the present invention include the three-layer structure type obtained by forming an adhesive layer on a polyimide film and then applying a copper foil to the adhesive layer or the two-layer structure type obtained by forming a polyimide precursor layer on the surface of a copper foil and then imidating the precursor layer by heating.

In case of the three-layer type, the thickness of the polyimide film is 12 $\mu$m or more and 100 $\mu$m or less, the thickness of the adhesive layer is 10 $\mu$m or more and 25 $\mu$m or less, and the thickness of the copper foil is 8 $\mu$m or more and 35 $\mu$m or less.

In case of the two-layer type, the thickness of the polyimide film is 10 $\mu$m or more and 40 $\mu$m or less and the thickness of the copper foil is 8 $\mu$m or more and 35 $\mu$m or less. A liquid resist is applied on either type of copper-clad film, then dried, exposed and developed, after which the copper foil is etched with an aqueous cupric chloride solution (subtractive process) to form an intended conductive circuit.

FIGS. 1a to 1e show a flow sheet for the two-layer type. In FIG. 1a, the numeral reference 1 represents a two-layer type substrate carrying a conductive circuit 12 formed by applying and imidating a polyimide precursor on the surface of a copper foil to form a polyimide film 11 and then patterning the copper foil.

Figure 1B:
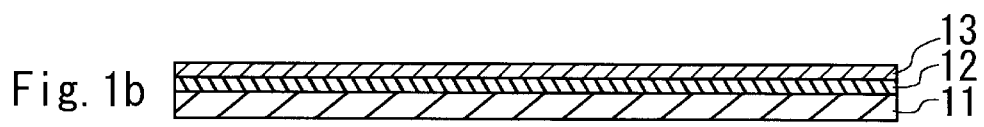
FIG. 1b shows the state in which a polyimide precursor layer has been formed on the conductive circuit.

Then, a polyimide precursor layer 13 forming a protective layer is formed on the conductive circuit 12, as shown in FIG. 1b. The polyimide precursor here is a so-called polyamic acid, which is synthesized from an acid dianhydride and a diamine. The acid anhydride includes pyromellitic anhydride, biphenyltetracarboxylic anhydride, bis(3,4-dicarboxyphenyl)sulfone dianhydride, bis(3,4-dicarboxyphenyl)ether dianhydride, benzophenone tetracarboxylic dianhydride, etc., and the diamine includes p-phenylenediamine, 4,4'-diaminodiphenyl ether, 2,2'-bis[4-(4-aminophenoxy)phenyl]propane, 2,2'-bis[4-(4-aminophenoxy)phenyl]sulfone, 4,4'-diaminobenzanilide, 1,4-bis(4-aminophenoxy)benzene, etc.

Said acid anhydride and diamine are dissolved/dispersed in a ratio of 10:9 to 9:10 in a polar solvent including pyrrolidone solvents such as N-methyl-2-pyrrolidone, acetamide solvents such as N,N'-dimethylacetamide or phenol solvents such as cresol, to prepare a coating solution, which may be directly applied on the conductive circuit 12 with a known coating device such as a roll coater, a knife coater and a bar coater to form the polyimide precursor layer 13, or a film of a polyimide precursor layer may be formed from said coating solution and then applied on the conductive circuit 12 to form the polyimide precursor layer 13. Generally, direct application on the conductive circuit is convenient because it is easy and free from inclusion of air during film lamination.

Typically, the thickness of the polyimide precursor layer 13 is suitably 5 $\mu$m or more and 30 $\mu$m or less.

Figure 1C:
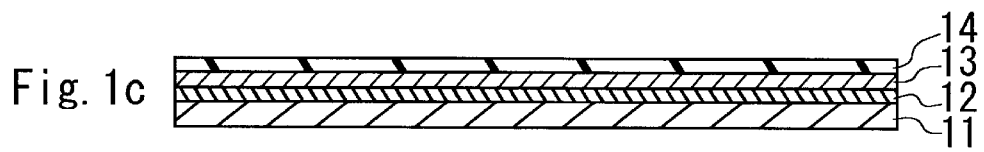
FIG. 1c shows the state in which a photoresist layer has been formed on the polyimide precursor layer.

Then, a solution of a photoresist composition of the present invention is applied on the polyimide precursor layer 13 with a known coating device such as a roll coater, a knife coater and a bar coater, and an excess of the solvent is evaporated to form a photoresist layer 14, as shown in FIG. 1c. Such a photoresist layer 14 typically has a thickness of 5 $\mu$m or more and 20 $\mu$m or less.

Figure 1D:
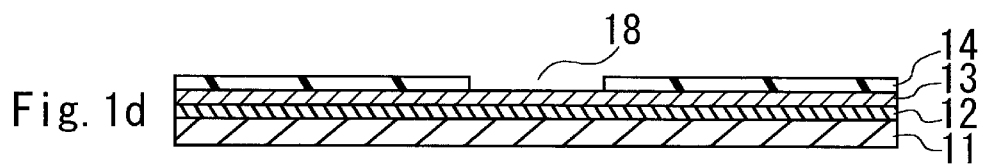
FIG. 1d shows the state in which the photoresist layer has been patterned.

Then, the photoresist layer 14 is patterned. Namely, the photoresist layer 14 is exposed to a UV exposure apparatus through a mask film having a defined shape applied thereon to form uncured portions and cured portions. The uncured portions are washed with water to remove them so that an opening 18 is formed in the photoresist layer 14 as shown in FIG. 1d. At the bottom surface of the opening 18, the surface of the polyimide precursor layer 13 is exposed. The remainder of the polyimide precursor layer 13 is protected with the cured portions of the photoresist layer 14.

Figure 1E:
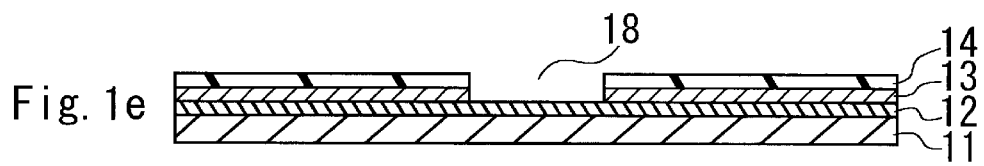
FIG. 1e shows the state in which the pattern of the photoresist layer has been transferred to the polyimide precursor layer.

Then, the polyimide precursor layer 13 exposed at the bottom surface of the opening 18 is etched off with an alkaline developing solution such as potassium hydroxide so that the surface of the conductive circuit 12 is exposed at the bottom surface of the opening 18, as shown in FIG. 1e.

Figure 1F:
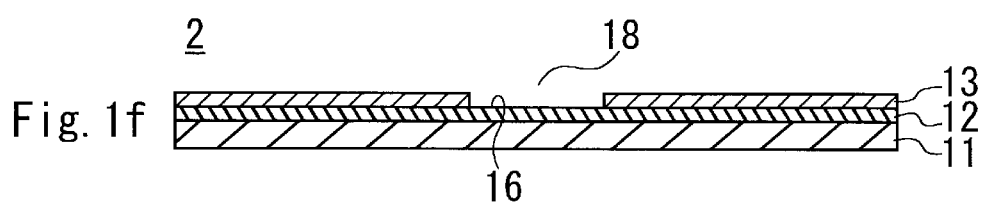
FIG. 1f shows an example of the flexible printed wiring board having a two-layer structure according to the present invention.

Then, the photoresist layer 14 remaining on the polyimide layer 13 is stripped off with a strong acid solution such as hydrochloric acid, after which the polyimide precursor layer is imidated by heating at 200° C. to 350° C. for several hours to give a flexible printed wiring board 2 having a terminal part 16 consisting of the conductive circuit 12 exposed at the bottom surface of the opening 18, as shown in FIG. 1f.

Figure 2:
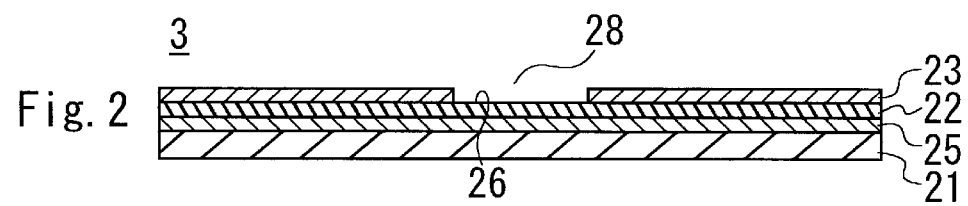
FIG. 2 shows an example of the flexible printed wiring board having a three-layer structure according to the present invention.

The reference 3 in FIG. 2 represents a three-layer structure flexible printed wiring board comprising an adhesive layer 25, a conductive circuit 22 and a polyimide precursor layer 23 formed on a polyimide film 21, wherein the surface of the conductive circuit 22 is exposed at the bottom surface of an opening 28 in the polyimide precursor layer 23 to form a terminal part 26.

EXAMPLES

The following examples further illustrate the present invention as compared with a comparative example.

Example 1
Formation of a Polyimide Precursor Layer

A substrate consists of a polyimide film and a conductive circuit. On the surface of the conductive circuit patterned on the substrate was applied a polyimide precursor solution of 176.1 parts by weight of pyromellitic dianhydride (Mitsubishi Chemical Corporation) as an acid anhydride, 43.3 parts by weight of p-phenylenediamine (Mitsui Chemicals, Inc.) as a diamine and 80.15 parts by weight of 4,4'-diaminophenyl ether (Wakayama Seika Kogyo Co., Ltd.) dissolved in N-methyl-pyrrolidone, and N-methyl-pyrrolidone was evaporated to form an intended polyimide precursor layer.

Formation of a Photoresist Layer (1) Synthesis of an amino-group-containing resin: In a monomer solution of 270 parts by weight of N,N-dimethylaminoethyl acrylate and 30 parts by weight of hydroxyethyl acrylate was dissolved 0.75 parts by weight of azoisobutyronitrile as a polymerization initiator. Then, an aliquot of 90 parts by weight of this monomer solution was added to 150 parts by weight of ethyl acetate for polymerization at a reflux temperature of 85° C. for about one hour. Then, the remaining monomer solution was added dropwise over one hour to continue polymerization, and a solution of 1.5 parts by weight of azoisobutyronitrile in 150 parts by weight of ethyl acetate was further added dropwise over 30 minutes and the mixture was allowed to stand at reflux temperature for about 2 hours to give an amino-group-containing resin solution in which the monomers had completely been polymerized. This solution had a solid content of 55.5% by weight and a viscosity of 4.5 Pa.s.

(2) Preparation of a photoresist composition solution: In a dissolving vessel equipped with a stirrer were charged 35 parts by weight of a water-soluble nylon (trade name: AQ nylon P-70 made by Toray Industries, Inc.), 145 parts by weight of ethanol and 85 parts by weight of toluene and stirred while the dissolving vessel was warmed at a temperature of 50° C. to homogeneously dissolve said water-soluble nylon.

Then, warming of the dissolving vessel was stopped to return it to normal temperature, after which were added 65 parts by weight by weight of tetramethylolmethane triacrylate (trade name: A-TMM-3L, Shin-Nakamura Chemical Co., Ltd.), 3.25 parts by weight of 2,4-diethylthioxanthone (tradename: DETX-S, Nippon Kayaku Co., Ltd.) as a photoinitiator, 3.25 parts by weight of p-diemthylaminobenzoic acid ethyl ester (trade name: EPA, Nippon Kayaku Co., Ltd.) as a photoinitiation aid, 0.1 part of a blue pigment (Victoria blue) as a photosensitizer and 1.0 part of the amino-group-containing acrylic resin prepared by the above procedure and thoroughly stirred in the dark to give an intended photoresist composition.

(3) Application of the photoresist composition solution: Then, the photoresist composition solution was applied on the polyimide precursor layer prepared as above under a yellow lamp, and ethanol and toluene were evaporated to give a photoresist layer of 20 $\mu$m in thickness.

Evaluation Method (1) Patterning accuracy: Said photoresist layer was exposed to a UV exposure apparatus (trade name: HTE-178SR-HC made by Hitec, exposure dose: 75 mJ/c) through a mask film capable of forming unexposed portions in a parallel pattern of 100 $\mu$m and a circular pattern having a diameter of 200 $\mu$m applied thereon.

Then, unexposed portions were washed with water at pH 6.0 (20° C.) for about 30 seconds and air-dried to measure the width of patterns by a two-dimensional coordinate analyzer.

For parallel patterns, those having a pattern width within a good range of ±1.0 $\mu$m from an ideal pattern width of 100 $\mu$m are evaluated as "○", those within a practically usable range of ±2.0 $\mu$m are evaluated as "Δ", and those with a greater deviation are evaluated as "X".

For circular patterns, those having a diameter within a good range of ±1.0 $\mu$m from an ideal diameter of 200 $\mu$m are evaluated as "○", those within a practically usable range of ±2.0 $\mu$m are evaluated as "Δ", and those with a greater deviation are evaluated as "X".

(2) Adhesion of the photoresist layer

Then, the portions of the polyimide precursor layer unprotected with the resist were removed by immersion in a 9 wt % aqueous solution of potassium hydroxide as an alkaline developing solution for about 10 minutes followed by warm water jet at 40° C. The case where no separation of the resist was observed under the action of the potassium hydroxide solution or warm water jet was evaluated as "○", while the case where separation of the resist was observed was evaluated as "X".

Results

Evaluation results are shown in the following Table 1.

TABLE 1

| | Photoresist layer composition | | | Evaluation | | |
|---|---|---|---|---|---|---|
| | Photo-polymerizable oligomer (parts by weight) | Water-soluble nylohn (parts by weight) | Amino-group-containing resin (parts by weight) | Adhesion of resist | Accuracy of resist | |
| | | | | | Parallel pattern | Circular pattern |
| Example 1 | 65 | 35 | 1.0 | ○ | ○ | ○ |
| Example 2 | 80 | 20 | 1.0 | ○ | ○ | ○ |
| Example 3 | 65*1 | 35 | 2.0 | ○ | ○ | ○ |
| Example 4 | 65 | 35 | 5.0 | ○ | ○ | ○ |
| Example 5 | 65 | 35 | 6.0 | ○ | ○ | ○ |

TABLE 1-continued

| | Photoresist layer composition | | | Evaluation | | |
|---|---|---|---|---|---|---|
| | Photo-polymerizable | Water-soluble | Amino-group-containing | | Accuracy of resist | |
| | oligomer (parts by weight) | nylohn (parts by weight) | resin (parts by weight) | Adhesion of resist | Parallel pattern | Circular pattern |
| Example 6 | 65 | 35 | 0.5 | ○ | Δ | Δ |
| Comparative example 1 | 65 | 35 | 0 | x | ○ | x |

*[1]EHC-modified trimethylolpropane triacrylate (Deconal DA-321, NAGASE & COMPANY, LTD.)

Table 1 shows that the photoresist layer of Example 1 was good because it was not separated from the polyimide precursor layer during etching. Patterning accuracy of the photoresist layer was also good.

After the evaluations were finished, the photoresist layer was immersed in a 2% hydrochloric acid solution to remove cured portions of the photoresist. Said resist was removed without remaining on the polyimide precursor layer. Then, said precursor layer was imidated to complete a flexible printed wiring board having a protective layer consisting of a polyimide layer.

Examples 2–6 and Comparative Example 1

Photoresist layers were prepared by the same procedure as in Example 1 except that photoresist compositions shown in Table 1 were used, and evaluations were made by the same procedure as in Example 1.

Results

Results are shown in the above Table 1.

Table 1 shows that the photoresist layers of Example 2 to 6 were good because they were not separated from the polyimide precursor layer during etching.

Here, the photoresist layer of Example 6 containing the amino-group-containing resin in an amount as small as 0.5 parts by weight tended to show a somewhat degraded parallel and circular patterns.

After the evaluations were finished, the photoresist layers were immersed in a 2% hydrochloric acid solution to remove cured portions of the photoresists. Said resists were removed without remaining on the polyimide precursor layer. Then, said precursor layer was imidated to complete flexible printed wiring boards having a protective layer consisting of a polyimide layer.

However, the photoresist layer of Comparative example 1 was poor in adhesion to the polyimide precursor layer and separated during etching to fail in forming a protective layer having an intended pattern.

The conductive circuit may also be carried on other types of resin films in place of the polyimide film as used in the foregoing examples.

ADVANTAGES OF THE INVENTION

Thus, photoresist compositions of the present invention succeeded in enhancing adhesion to the polyimide precursor layer forming a protective layer of a flexible printed wiring board having such a protective layer, so that the photoresist layer is not separated during etching.

Moreover, high-accuracy etching can be attained because any etching solution can not enter between the photoresist layer and the polyimide precursor layer.

Furthermore, a polyimide layer forming a protective layer with high etching accuracy can be formed as a result of the high patterning accuracy of the photoresist layer.

What is claimed is:

1. A method of making a flexible printed wiring board comprising a conductive circuit and a patterned polyimide layer on the conductive circuit, comprising:

forming a polyimide precursor layer on the conductive circuit;

applying a photoresist composition, wherein the photoresist composition comprises: a photopolymerizable organic material (A), a water-soluble resin (B), and an amino-group-containing resin (C) on a surface of the polyimide precursor layer to form a photoresist layer, wherein the amino-group-containing resin (C) consists of a homopolymer of N,N-dimethyl aminoacrylate, N,N-diethylaminoethyl acrylate, N,N-dimethyl aminomethacrylate, or N-N-diethylaminoethyl methacrylate, or a copolymer consisting of X and Y wherein X is selected from the group consisting of N,N-dimethyl aminoacrylate, N,N-diethylaminoethyl acrylate, N,N-dimethyl aminomethacrylate, and N-N-diethylaminoethyl methacrylate, and Y is selected from the group consisting of methyl acrylate, ethyl acrylate, butyl acrylate, methyl methacrylate, hydroxyethyl acrylate, hydroxymethyl methacrylate, hydroxyethyl methacrylate, hydroxypropyl methacrylate. styrene, and butadiene, wherein the amino-group containing resin (C) in the range from 1.0 part by weight to 5.0 parts by weight both inclusive based on 100 parts by weight of the total weight of the photopolymerizable organic material (A) and the water-soluble resin (B), and wherein the photopolymerizable organic material (A) is in the range of from 30% by weight to 90% by weight and the water-soluble resin (B) is in the range of from 20% by weight to 50% by weight;

exposing and developing the photoresist layer to cure and pattern as a predetermined pattern;

removing the polyimide precursor layer exposed at a bottom of an opening on the photoresist layer by etching to pattern the polyimide precursor layer; and heating the patterned polyimide precursor layer to imidate after exfoliating the photoresist layer.

2. The method of making a flexible printed wiring board according to claim 1, wherein the water-soluble resin (B) includes at least one of a water-soluble nylon and an alcohol-soluble nylon.

* * * * *